(12) United States Patent
Laskaris et al.

(10) Patent No.: US 7,242,191 B2
(45) Date of Patent: Jul. 10, 2007

(54) COLD MASS SUPPORT STRUCTURE AND HELIUM VESSEL OF ACTIVELY SHIELDED HIGH FIELD OPEN MRI MAGNETS

(75) Inventors: Evangelos Laskaris, Schenectady, NY (US); Xianrui Huang, Clifton Park, NY (US); Michele Dollar Ogle, Burnt Hills, NY (US); Michael A. Palmo, Ballston Spa, NY (US); Paul S. Thompson, Stephentown, NY (US)

(73) Assignee: General Electric Company, Niskayuna, NY (US)

( * ) Notice: Subject to any disclaimer, the term of this patent is extended or adjusted under 35 U.S.C. 154(b) by 440 days.

(21) Appl. No.: 10/065,848

(22) Filed: Nov. 25, 2002

(65) Prior Publication Data

US 2004/0100261 A1 May 27, 2004

(51) Int. Cl.
*G01V 3/00* (2006.01)
(52) U.S. Cl. ........................ 324/318; 324/319; 324/320
(58) Field of Classification Search ................ 324/318, 324/319, 309, 320, 300; 29/609; 335/201, 335/216, 296, 301, 299, 306
See application file for complete search history.

(56) References Cited

U.S. PATENT DOCUMENTS

| | | | | |
|---|---|---|---|---|
| 5,168,211 A * | 12/1992 | Laukien et al. | ............. | 324/319 |
| 5,194,810 A * | 3/1993 | Breneman et al. | .......... | 324/319 |
| 5,276,399 A * | 1/1994 | Kasten et al. | ................ | 324/319 |
| 5,307,039 A | 4/1994 | Chari et al. | .................. | 355/299 |
| 5,315,276 A * | 5/1994 | Huson et al. | ................ | 335/216 |
| 5,347,252 A | 9/1994 | Ries | ........................... | 335/299 |
| 5,359,310 A * | 10/1994 | Pissanetzky | ................ | 335/301 |
| 5,378,988 A * | 1/1995 | Pulyer | ........................ | 324/318 |
| 5,485,088 A | 1/1996 | Westphal et al. | ........... | 324/320 |
| 5,565,831 A | 10/1996 | Dorri et al. | .................. | 335/216 |
| 5,696,476 A * | 12/1997 | Havens et al. | .............. | 335/216 |
| 5,864,275 A * | 1/1999 | Ohashi et al. | .............. | 335/306 |
| 5,874,880 A | 2/1999 | Laskaris et al. | | |
| 5,874,882 A | 2/1999 | Laskaris et al. | | |
| 5,883,558 A | 3/1999 | Laskaris et al. | | |
| 5,963,117 A * | 10/1999 | Ohashi et al. | .............. | 335/306 |
| 5,994,991 A | 11/1999 | Laskaris et al. | | |
| 5,999,075 A | 12/1999 | Laskaris et al. | | |
| 6,011,454 A * | 1/2000 | Huang et al. | ................ | 335/216 |
| 6,147,579 A * | 11/2000 | Einziger et al. | ............ | 335/299 |
| 6,150,819 A | 11/2000 | Laskaris et al. | | |
| 6,157,279 A | 12/2000 | Laskaris et al. | | |
| 6,166,617 A | 12/2000 | Laskaris et al. | | |
| 6,172,588 B1 | 1/2001 | Laskaris et al. | | |
| 6,201,394 B1 * | 3/2001 | Danby et al. | ................ | 324/319 |
| 6,211,676 B1 * | 4/2001 | Byrne et al. | ................. | 324/319 |
| 6,218,838 B1 * | 4/2001 | McGinley et al. | .......... | 324/320 |

(Continued)

FOREIGN PATENT DOCUMENTS

WO    WO 01/53847 A1 *    7/2001

*Primary Examiner*—Brij Shrivastav
*Assistant Examiner*—Tiffany A. Fetzner
(74) *Attorney, Agent, or Firm*—Fletcher Yoder

(57) ABSTRACT

An open magnetic resonance imaging (MRI) device is provided with at least one main coil for generating a magnetic field for imaging a volume, and at least one shaping coil. The at least one shaping coil is positioned relative to the at least one main coil to shape the magnetic field in the volume.

36 Claims, 3 Drawing Sheets

U.S. PATENT DOCUMENTS

| | | |
|---|---|---|
| 6,259,252 B1 * | 7/2001 | Laskaris et al. ............ 324/319 |
| 6,335,670 B1 * | 1/2002 | Kinanen .................... 335/296 |
| 6,570,475 B1 * | 5/2003 | Lvovsky et al. ............ 335/216 |
| 6,600,318 B1 * | 7/2003 | Kakugawa et al. ......... 324/318 |
| 6,717,408 B2 * | 4/2004 | Minas et al. ................ 324/318 |
| 6,853,281 B1 * | 2/2005 | Kakugawa et al. ......... 335/296 |
| 7,071,694 B1 * | 7/2006 | Kruip ........................ 324/323 |
| 2002/0145426 A1 * | 10/2002 | Minas et al. ................ 324/318 |
| 2003/0001575 A1 * | 1/2003 | Cheng et al. ............... 324/318 |
| 2004/0100261 A1 * | 5/2004 | Laskaris et al. ............ 324/318 |

* cited by examiner

COLD MASS SUPPORT STRUCTURE AND HELIUM VESSEL OF ACTIVELY SHIELDED HIGH FIELD OPEN MRI MAGNETS

BACKGROUND OF THE INVENTION

The present invention relates generally to magnetic resonance imaging (MRI) devices, and more particularly to MRI devices with at least one shaping coil to shape a magnetic field for imaging a volume, and MRI devices with a single unit support structure.

MRI devices are widely used in the medical community as a diagnostic tool for imaging items such as tissue and organ structures. A conventional MRI device is described, for example, in U.S. Pat. No. 6,172,588 (the "'588 patent" hereafter), which is incorporated by reference herein in its entirety. As described in the '588 patent, known resistive and superconductive ("SC" hereafter) MRI magnet designs include closed magnets and open magnets. Closed magnets typically have a single, tubular-shaped resistive or SC coil assembly having a bore. The coil assembly includes several radially-aligned and longitudinally spaced-apart resistive or SC main coils each carrying a large, identical electric current in the same direction. The main coils are thus designed to create a magnetic field of high uniformity within a typically spherical imaging volume centered within the magnet's bore where the object to be imaged is placed.

A single, tubular-shaped shielding assembly may also be used to prevent the high magnetic field created by and surrounding the main coils from adversely interacting with electronic equipment in the vicinity of the magnet. Such shielding assembly typically includes several radially-aligned and longitudinally spaced-apart resistive or SC bucking coils carrying electric currents of generally equal amperage, but in an opposite direction to the electric current carried in the main coils and positioned radially outward of the main coils.

Open magnets, including "C" shaped magnets, typically employ two spaced-apart coil assemblies with the space between the assemblies containing the imaging volume. The spaced-apart coil assemblies thus allow for access by medical personnel for surgery or other medical procedures during magnetic resonance imaging. The patient may be positioned in that space or also in the bore of the toroidal-shaped coil assemblies. The open space helps the patient overcome any feelings of claustrophobia that may be experienced in a closed magnet design.

Known open magnet designs having shielding include those wherein each coil assembly has an open bore and contains a resistive or SC shielding coil positioned longitudinally and radially outward from the resistive or SC main coil(s). It is also known in open magnet designs to place an iron pole piece in the bore of a resistive or SC coil assembly. The iron pole piece enhances the strength of the magnetic field and, by shaping the surface of the pole piece, magnetically shims the magnet improving the homogeneity of the magnetic field. An iron return path is used to connect the two iron pole pieces. It is noted that the iron pole piece also acts to shield the magnet.

Conventional MRI devices, however, have limited imaging accuracy for several reasons. At least part of the limited accuracy is due to manufacturing tolerances, which inherently lead to variations from one manufactured MRI device to another. Manufacturing tolerance errors in known MRI devices are aggravated by conventional multi-unit support structures therein, which may include a considerable number of locations where manufacturing induced variations can occur (e.g., placement and/or alignment errors in positioning coils, etc.).

Furthermore, the MRI magnet itself may suffer from manufacturing variations, such as slight variations in the positioning of the windings thereof, etc. Hence, to compensate for these problems, conventional techniques for manufacturing MRI devices involve intricate and involved regimes for placing and adjusting the MRI device components mounted on the support structure. This can lead to higher manufacturing costs, longer manufacturing lead times, and generally more complex MRI devices.

Thus, a need exists for a MRI device which provides greater magnetic field homogeneity within the magnet's imaging volume, and a method of manufacturing the MRI device to tighter tolerances.

BRIEF SUMMARY OF THE INVENTION

The present invention is directed at reducing or eliminating one or more of the problems set forth above, and other problems found within the prior art.

According to one embodiment of the present invention, an open magnetic resonance imaging (MRI) device is provided with at least one main coil for generating a magnetic field for imaging a volume, and at least one shaping coil. The at least one shaping coil is positioned relative to the at least one main coil to shape the magnetic field in the volume.

The open MRI device may include a single unit support structure, wherein the at least one main coil is positioned on an outer surface of the single unit support structure, and wherein the at least one shaping coil is positioned on an inner surface of the single unit support structure.

Preferably, the single unit support structure comprises a substantially cylindrical shell, a hub positioned along a substantially central axis of the cylindrical shell and a plurality of gussets positioned within the cylindrical shell, each of the gussets extending radially outward from the hub. More preferably, the single unit support structure further comprises at least one support post positioned between a first half and a second half of the cylindrical shell.

According to another embodiment of the present invention a magnetic resonance imaging (MRI) apparatus for imaging a volume is provided comprising at least one main coil configured to generate a magnetic field, at least one bucking coil configured to shield the at least one main coil, a plurality of shaping coils to shape the magnetic field in the volume, and a plurality of iron rings for shielding interactions between coils of opposite polarity, at least one of the plurality of iron rings being positioned between the at least one main coil and the at least one bucking coil.

According to another embodiment of the present invention, a magnetic resonance imaging (MRI) apparatus for imaging a volume is provided comprising means for generating a magnetic field for imaging the volume, means for shielding the means for generating, and means for shaping the magnetic field.

DETAILED DESCRIPTION OF THE INVENTION

Reference will now be made in detail to presently preferred embodiments of the present invention. Wherever possible, the same reference numbers will be used throughout the drawings to refer to the same or like parts.

Figure 1:
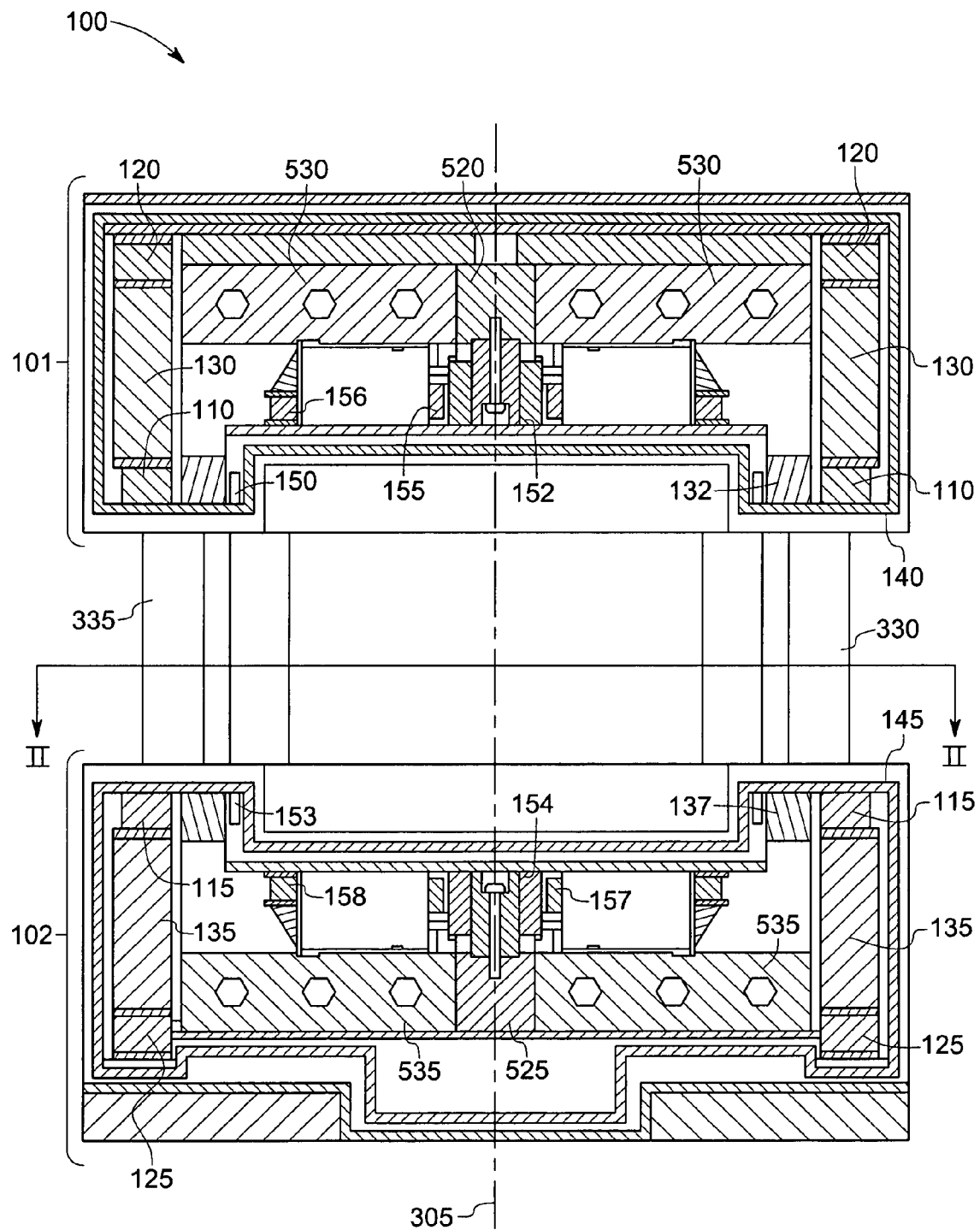
FIG. 1 is a cross sectional view of an MRI device according to an embodiment of the present invention.

An open MRI device according to a first embodiment of the present invention is shown in FIG. 1. Preferably, the MRI device includes a 0.5 Tesla or higher magnet (e.g., about 0.5 Tesla to about 1.5 Tesla). By way of example but not by way of limitation, a 1.2 Tesla configuration is shown in FIG. 1, and will be described in detail below. Other configurations are also possible as would be readily apparent to one of ordinary skill in the art after reading this disclosure.

As shown in FIG. 1, the MRI device 100 according to this first embodiment includes main coils 110, 115 for generating a magnetic field for imaging a volume. Typical configurations employ two main coils 110, 115 as shown, one being positioned on each of two "halves" 101, 102 of the MRI device 100. The main coils 110, 115 are coupled to an electrical power source (not shown) for passing a current through the main coils 110, 115, thereby ramping up the magnetic field for imaging a volume. Typically, MRI magnets are only connected to an electrical power source for ramping the magnet up to field. Afterward, the electrical power supply may (or may not) be disconnected.

Bucking coils 120, 125 (a.k.a., shielding coils) are provided relative to the main coils 110, 115 to shield external devices from the fringe magnetic field generated by the main coils 110, 115. Preferably, two bucking coils 120, 125 are provided as shown, such that one bucking coil 120, 125 is provided for each main coil 110, 115, respectively. The bucking coils 120, 125 are also coupled to an electrical power source (not shown) for passing a current through the bucking coils 120, 125, thereby generating a shielding magnetic field for shielding the main coils 110, 115. According to one aspect of the present invention, the bucking coils 120, 125 are wound in a reverse direction compared to the respective main coils 110, 115, such that the polarity of a given bucking coil 120, 125 is opposite to that of the respective main coil 110, 115; i.e., the current in a bucking coil 120, 125 is opposite to that of the current in its respective main coil 110, 115. This provides the "shielding" effect for limiting the fringe field of the main coils 110, 115. Typically, the bucking coils 120, 125 have a dipole moment of relatively equal magnitude as that of the main coils 110, 115.

Iron rings 130, 135 are provided between the main coils 110, 115 and corresponding bucking coils 120, 125 in order to magnetically isolate (i.e., "shield") the main coils 110, 115 from the corresponding bucking coils 120, 125, and to provide additional structural support for the MRI device 100. Another function of iron rings 130, 135 is in controlling the magnetic forces of main coils 1110, 115 and bucking coils 120, 125.

Preferably, a pressure vessel 140, 145 is provided at least partially encapsulating the main coils 110, 115, and more preferably also the iron rings 130, 135 and/or bucking coils 120, 125 (if provided). The pressure vessel 140, 145 may be filled with liquid helium to allow for electrical and thermal joints/connections inside the pressure vessel 140, 145. Additionally, various components (e.g., SC coils such as the main coils 110, 115) may be coupled to a cooling device (not shown) for cooling a given component to operating levels. The pressure vessel 140, 145 would thus be adapted for necessary cooling lines, etc.

A single unit support structure may be provided for supporting the various MRI device components (e.g., main coils 110, 115; bucking coils 120, 125; iron rings 130, 135; pressure vessel 140, 145; etc.). The single unit support structure includes a substantially cylindrical shell defining therein a longitudinal central axis 305. Preferably, the single unit support structure is substantially symmetric about plane II-II bisecting the substantially cylindrical shell into two substantially identical halves 101 and 102. This provides relative uniformity in the magnetic field generated by the main coils 110, 115 on each half 101, 102.

The single unit support structure is preferably made of stainless steel. Alternatively, the single unit support structure could be made of aluminum or fiber-reinforced composites. It should be appreciated that the cylindrical shell; the hub portion (to be described below); the gussets (to be described below); and the posts 330, 335 (to be described below) are all preferably made from the same material, so as to undergo the same thermal contraction experienced during operation, and to simplify the manufacture of these parts if a welding technique is used therein. This allows for greater uniformity in the manufacturing and operation of the MRI device 100, and hence greater accuracy in the imaging thereby. Alternatively, different components may be made of different materials if desired, such as individual components made from different materials relative to one another, or a given component made from several different materials itself.

Each half 101, 102 of the MRI device 100 includes a corresponding hub portion. The hub portion includes a central hub 520, 525, and a plurality of gussets 530, 535 extending radially outward from the hub 520, 525. The gussets 530, 535 may include water-jet cut holes formed in plate members as shown if needed. Preferably, the plurality of gussets 530, 535 are welded to the central hub 520, 525 on one end, and to the cylindrical shell on the other end. Alternatively, other joining techniques, such as, but not limited to, gluing and bolting may be employed, especially in lower field designs. The single unit support structure is designed to have sufficient rigidity to limit motion from vibration and distortions from magnetic forces.

Figure 2:
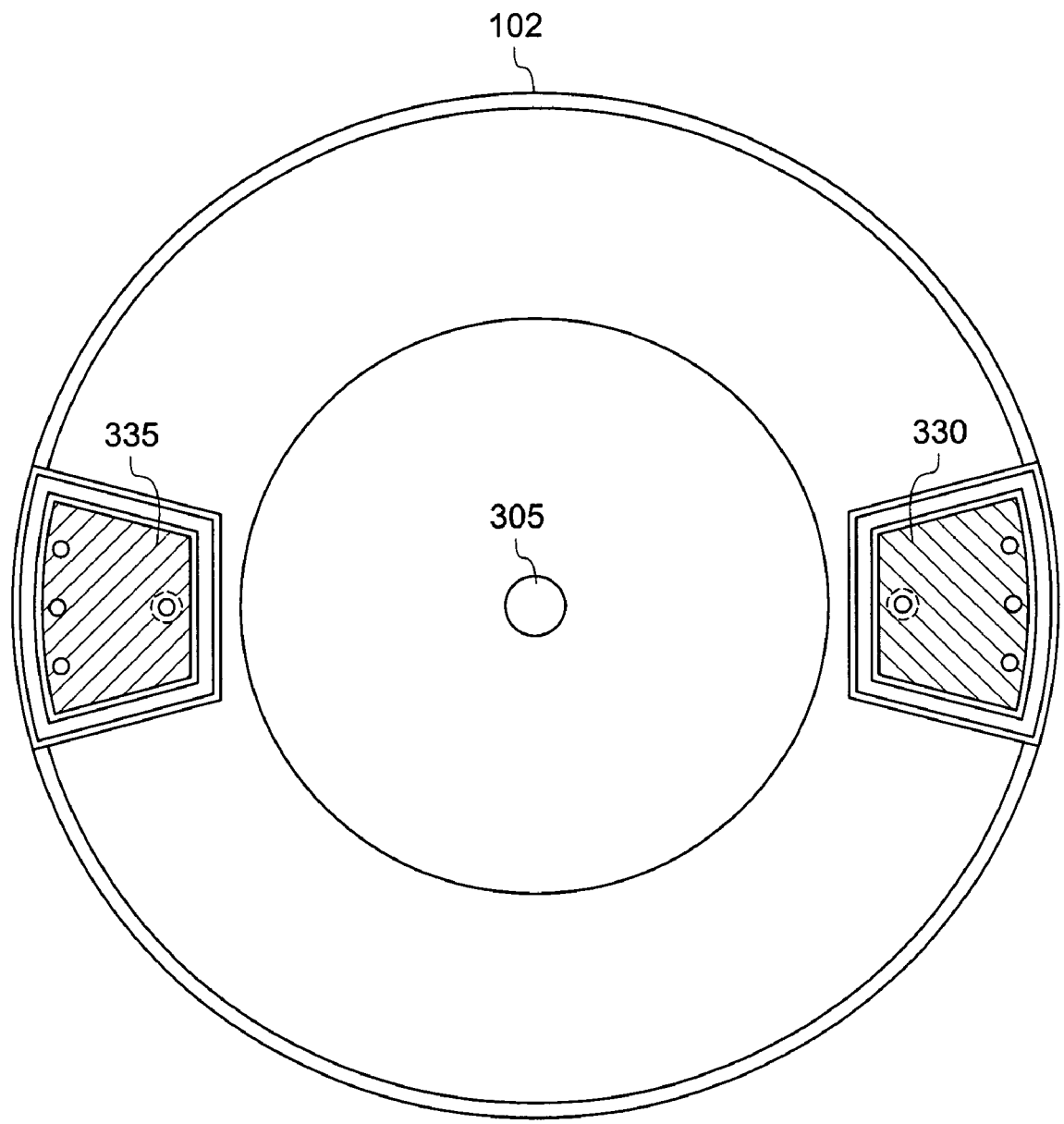
FIG. 2 is a cross sectional view looking downward at plane II-II in FIG. 1.
Figure 3:
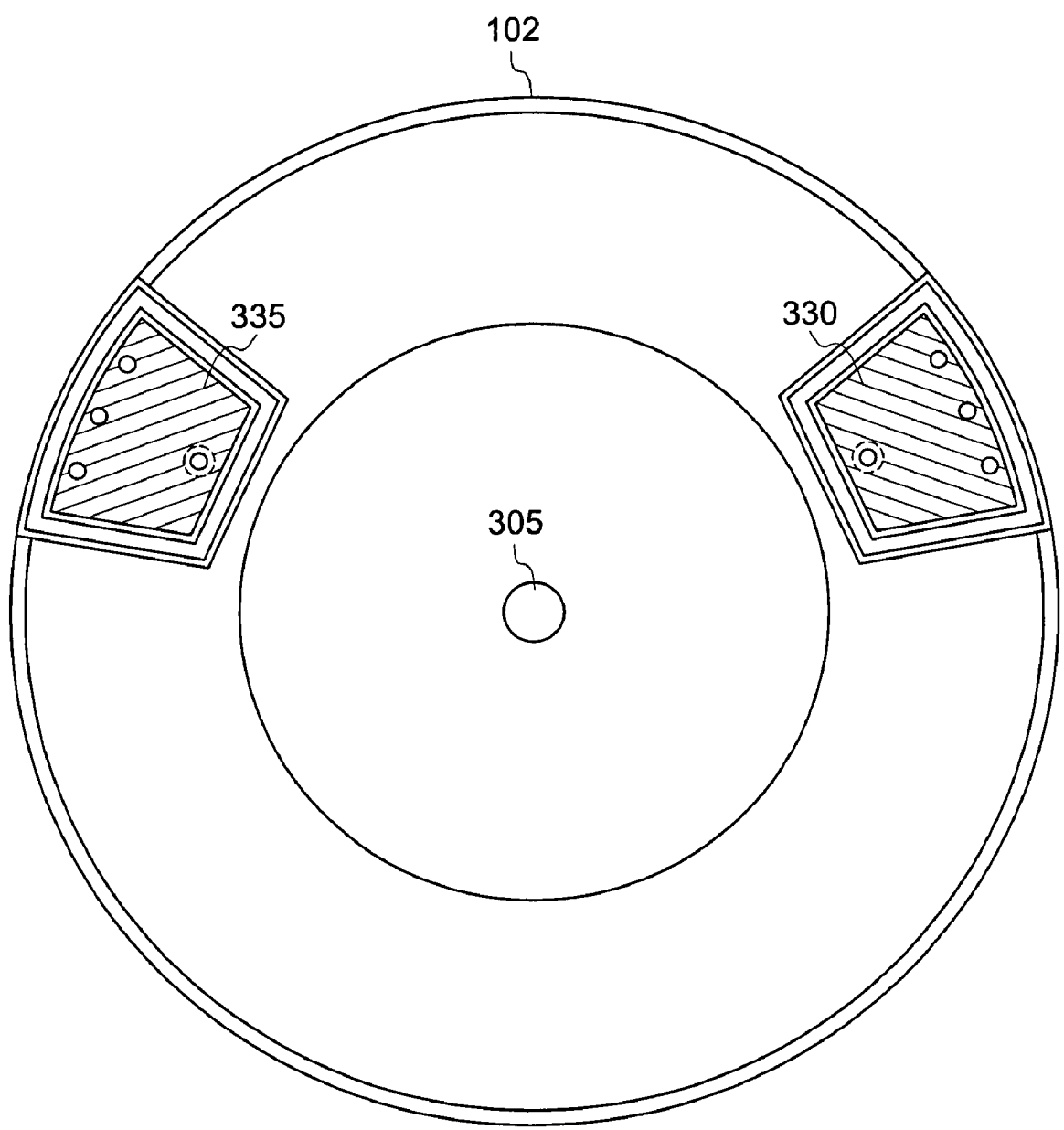
FIG. 3 is a cross sectional view of a single unit support structure according to an embodiment of the present invention.

As shown in FIG. 1, the two halves 101, 102 are joined via posts 330, 335. FIG. 2 depicts one example where the posts 330, 335 may be positioned on substantially opposite sides of longitudinal central axis 305 Preferably, however, the posts 330, 335 are offset slightly (e.g., about 67°) to give the patient the appearance of a more "open" environment, and to facilitate easier access to the patient (FIG. 3). Preferably, the posts 330, 335 have sufficient rigidity to withstand axial compressive forces acting thereon (e.g., from the magnetic force generated and the weight of MRI device components), as well as to limit any vibration which may occur during an imaging operation. By way of example, the posts 330, 335 would preferably have sufficient rigidity to withstand an axial compressive force of at least one million Newtons for a 1.2 Tesla magnet. The two halves 101, 102 may include flanged portions to facilitate attachment of the various coils/rings, and/or posts 330, 335.

As noted above, main coils 110, 115 are provided for generating a magnetic field for imaging a volume. The main coils 110, 115 may be positioned on an outer surface of the single unit support structure as shown (FIG. 1), preferably in close proximity to or abutting the flanged portions defining the interior most portions of each of the two halves 101, 102. Such a configuration provides close proximity between the main coils 110, 115 and the volume to be imaged, which increases the uniformity of the magnetic field passing therethrough. The main coils 110, 115 can be manufactured by any one of a number of conventional techniques as are well known in the art.

Bucking coils 120, 125 are also positioned on an outer surface of the single unit support structure, and relative to the main coils 110, 115 (as previously described) to shield external devices from the magnetic field generated by the main coils 110, 115. Hence, in order to properly shield the MRI device 100, bucking coils 120, 125 are configured to have polarities opposite to that of main coils 110, 115 respectively. The bucking coils 120, 125 can be manufactured by any one of a number of conventional techniques as are well known in the art.

Iron rings 130, 135 are positioned between the main coils 110, 115 and corresponding bucking coils 120, 125 on an outer surface of the single unit support structure in order to reduce the interaction of magnetic fields between the main coils 110, 115 and the corresponding bucking coils 120, 125. Furthermore, as shown in FIG. 1, additional iron rings 132, 137 may be provided to reduce the interaction of magnetic fields between the main coils 110, 115 and the shaping coils 150, 152, 153, 154, 155, 156, 157, 158. Other configurations are also possible, as would be readily apparent to one of ordinary skill in the art after reading this disclosure.

The aforementioned configuration is sufficient to image a volume with the MRI device. The present inventors have found that the aforementioned configuration has improved accuracy due to reduced and/or eliminated machining variations, and is easier (and hence less costly) to manufacture due to the relatively simple design.

To further improve the accuracy of the MRI device, however, field shaping coils 150, 152, 153, 154, 155, 156, 157, 158 are provided (FIG. 1), preferably on an inner surface of the single unit support structure. Field shaping coils 150, 152, 153, 154, 155, 156, 157, 158 are of a relatively small size in comparison to the main coils 110, 115, and function to shape the magnetic field generated by the main coils 110, 115 in the volume to be imaged. The use of multiple small shaping coils 150, 152, 153, 154, 155, 156, 157, 158 allows for the designer to have improved uniformity in the magnetic field over conventional MRI devices. It should be appreciated that the shaping coils 150, 152, 153, 154, 155, 156, 157, 1158 need not have the same polarity with respect to each other.

It should be noted that while FIG. 1 illustrates eight shaping coils, the present invention is not so limited. The number of shaping coils may be more or less than eight.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An open magnetic resonance imaging (MRI) device, comprising:
   a main coil configured to generate a magnetic field to image a volume, wherein the main coil comprises a first axis, a first radius, and a first axial distance from the volume;
   a plurality of shaping coils comprising second axes, second radii, and second axial distances from the volume, wherein the second radii are smaller than the first radius of the main coil, and wherein the second axial distances are greater than or equal to the first axial distance of the main coil to shape the magnetic field in the volume;
   a substantially cylindrical support comprising a third axis and a third radius, wherein the first, second, and third axes are generally aligned with one another, wherein the substantially cylindrical support is disposed radially between and completely separating the main coil and from the plurality of shaping coils; and
   a pressure vessel disposed about the main coil, the plurality of shaping coils, and the substantially cylindrical support.

2. The open MRI device of claim 1 wherein the main coil is positioned on an outer circumferential surface of the substantially cylindrical support, and
   wherein at least one of the shaping coils is positioned on an inner circumferential surface of the substantially cylindrical support.

3. The open MRI device of claim 1, comprising:
   a hub positioned along the third axis of the substantially cylindrical support; and
   a gusset positioned radially between the substantially cylindrical support and the hub.

4. The open MRI device of claim 1, comprising:
   at least one support post positioned between a first half and a second half of the open MRI device, wherein the first half comprises the main coil, the plurality of shaping coils, the substantially cylindrical support, and the pressure vessel, and the second half comprises another main coil, another plurality of shaping coils, another substantially cylindrical support, and another pressure vessel in generally the same arrangement as the first half.

5. The open MRI device of claim 4, wherein the at least one support post is attached on one end to a flange formed on the pressure vessel in the first half and attached on an opposite end to another flange formed on the other pressure vessel in the second half.

6. The open MRI device of claim 3, wherein at least one of:
   the substantially cylindrical support, the hub, or the gusset comprises stainless steel, aluminum, or fiber-reinforced composites.

7. The open MRI device of claim 2, further comprising:
   at least one ferromagnetic ring positioned on the outer circumferential surface of the substantially cylindrical support.

8. The open MRI device of claim 7, wherein the at least one ferromagnetic ring is positioned substantially between coils having opposite current directions to shield interactions between the coils having opposite current directions.

9. The open MRI device of claim 7, wherein the MRI device comprises at least four ferromagnetic rings.

10. The open MRI device of claim 2, further comprising:
    at least one shielding coil positioned on the outer circumferential surface of the substantially cylindrical support and configured to shield the magnetic field.

11. The open MRI device of claim 10, wherein the MRI device comprises at least two shielding coils.

12. The open MRI device of claim 1, wherein the MRI device comprises at least eight shaping coils.

13. The open MRI device of claim 1, wherein at least one of the shaping coils is configured to shape the magnetic field in the volume to a uniformity of at least 10 ppm.

14. The open MRI device of claim 1, wherein the MRI device comprises an even number of shaping coils.

15. The open MRI device claim 14, wherein a first half of the number of shaping coils have a first magnetic polarity and second half of the number of shaping coils have a second magnetic polarity substantially opposite that of the first magnetic polarity.

16. The open MRI device of claim 1, wherein at least one of the plurality of shaping coils has a magnetic polarity opposite to a magnetic polarity of another of the plurality of shaping coils.

17. A magnetic resonance imaging (MRI) apparatus for imaging a volume, comprising:
   at least one main coil configured to generate a magnetic field about the volume, wherein the at least one main coil comprises a first axis and a first radius;
   at least one bucking coil comprising a second axis and a second radius, wherein the at least one bucking coil is configured to shield the magnetic field from the at least one main coil;
   a plurality of shaping coils comprising third axes and third radii, wherein the plurality of shaping coils are configured to shape the magnetic field in the volume; and
   a plurality of ferromagnetic rings comprising fourth axes and fourth radii, wherein the plurality of ferromagnetic rings are configured to shield interactions between coils of opposite polarity, wherein the first, second, third, and fourth axes are generally aligned with one another, wherein at least one ring of the plurality of ferromagnetic rings is positioned axially between the at least one main coil and the at least one bucking coil, wherein the at least one main coil, the at least one bucking coil, and the at least one ring are positioned in a radially overlapping stacked relationship with each in the space directly on top of another.

18. The MRI apparatus of claim 17, further comprising: a single unit support structure configured to support the at least one main coil, the at least one bucking coil, the plurality of shaping coils, and the plurality of ferromagnetic rings.

19. The MRI apparatus of claim 18, wherein the single unit support structure comprises:
   a substantially cylindrical shell;
   a hub positioned along a substantially central axis of the cylindrical shell; and
   a gusset positioned radially between the substantially cylindrical shell and the hub.

20. A magnetic resonance imaging (MRI) apparatus for imaging a volume, comprising:
   means for generating a magnetic field for imaging the volume;
   means for shielding the magnetic field from means for generating; and
   means for shaping the magnetic field radially smaller than the means for generating the magnetic field and positioned axially further from the volume than the means for generating the magnetic field or in a plane of the means for generating the magnetic field; and
   means for intermediately shielding at a region that is at least substantially, or entirely, directly between the means for generating and the means for shielding, wherein the means for generating, the means for shielding, and the means for intermediately shielding at the region are positioned in an axially stacked relationship with each in the space directly on top of another.

21. The MRI apparatus of claim 20, further comprising: means for supporting the means for generating, the means for shielding, the means for shaping, and the means for intermediately shielding.

22. The MRI apparatus of claim 20, wherein the means for intermediately shielding comprises:
   means for intermediately shielding interactions between opposite polarities of the means for generating and the means for shielding.

23. An open magnetic resonance imaging (MRI) device, comprising:
   first and second main coils configured to generate a magnetic field to image a volume;
   first and second sets of shaping coils positioned adjacent to each of the first and second main coils, respectively, each set of shaping coils being radially smaller than the respective main coils and positioned axially further from the volume than the respective main coil or in a plane of the respective main coil to shape the magnetic field in the volume;
   a cylindrical support structure comprising a first cylindrical portion and a second cylindrical portion, wherein the first cylindrical portion is disposed radially between and completely separating the first main coil form the first set of shaping coils, and the second cylindrical portion is disposed radially between and completely seperating the second main coil from the second set of shaping coils; and
   an enclosure comprising a first enclosure portion and a second enclosure portion, wherein the first enclosure portion is disposed about the first main coil, the first set of shaping coils, and the first cylindrical portion, and the second enclosure portion is disposed about the second main coil, the second set of shaping coils, and the second cylindrical portion.

24. The open MRI device of claim 1, comprising a ferromagnetic ring disposed in an axially stacked with the main coil.

25. The open MRI device of claim 24, comprising a shielding coil disposed in the axially stacked relationship with the main coil and the ferromagnetic ring.

26. The open MRI device of claim 1, comprising a shielding coil and a ferromagnetic ring, wherein the ferromagnetic ring is disposed directly axially between the main coil and the shielding coil.

27. The open MRI device of claim 1, comprising a shielding and a ferromagnetic ring disposed between the main coil and the shielding coil, wherein the main coil, the magnetic ring, and the shielding coil are generally positioned in an axially stacked relationship with one another.

28. The open MRI device of claim 27, wherein the pressure vessel is disposed about the main coil, the ferromagnetic ring, the shielding coil, the plurality of shaping coils, and the substantially cylindrical support.

29. The open MRI device of claim 28, comprising a central hub and a gusset disposed radially inside the substantially cylindrical support, wherein the central hub is disposed radially inside the gusset.

30. The MRI device of claim 21, wherein the means for supporting is disposed radially outside the means for shaping and radially inside the means for generating, the means for shielding, and the means for intermediately shielding.

31. The open MRI device of claim 23, comprising:
   first and second shielding coils disposed axially about the first and second main coils, respectively; and first and second ferromagnetic rings disposed axially between the first and second main coils and the first and second shielding coils, repsectively.

32. The open MRI device of claim 31, wherein the first main coil, the first ferromagnetic ring, and the first shielding coil are generally positioned in an axially stacked relationship with each in the space directly on top of another; and wherein the second main coil, the second ferromagnetic ring, and the second shielding coil are generally positioned in another axially stacked relationship with each in the space directly on top of another.

33. A magnetic resonance imaging (MRI) device, comprising: opposite cylindrical supports disposed about a magnetic resonance imaging region;
  opposite shaping coils disposed about the magnetic resonance imaging region, wherein the opposite shaping coils are disposed concentrically within the opposite cylindrical supports, respectively;
  opposite main coils disposed about the magnetic resonance imaging region, wherein the opposite main coils are disposed concentrically about the opposite cylindrical supports, respectively;
  opposite ferromagnetic rings disposed concentrically about the opposite cylindrical supports, respectively; and
  opposite shielding coils disposed concentrically about the opposite cylindrical supports, respectively;
  wherein the opposite main coils, the opposite ferromagnetic rings, and the opposite shielding coils are positioned in an axially stacked relationship with each in the space directly on top of another along the opposite cylindrical supports, respectively;
  wherein the opposite ferromagnetic rings are disposed axially between the opposite main coils and the opposite shielding coils, respectively,
  wherein the opposite cylindrical supports separate the opposite shaping coils from the opposite main coils, the opposite ferromagnetic rings, and the opposite shielding coils.

34. The MRI device of claim 33, wherein the opposite ferromagnetic rings are configured to shield interactions between the opposite main coil and opposite shielding coils, respectively.

35. The MRI device of claim 33, comprising opposite pressure vessels disposed about the opposite cylindrical supports, the opposite shaping coils, the opposite main coils, the opposite ferromagnetic rings, and the opposite shielding coils, respectively.

36. A magnetic resonance imaging (MRI) device, comprising:
  a MRI main coil;
  a MRI shielding coil; and
  a MRI ferromagnetic ring, wherein the MRI ferromagnetic ring is positioned axially between and completely seperating the MRI main coil and the MRI shielding coil in the axially stacked MRI arrangement with each in the space directly on top of another wherein the axially stacked MRI arrangement is coupled to a single cylindrical support structure; and
  a pressure vessel disposed about the axially stacked MRI arrangement and the single cylindrical support structure.

* * * * *